(12) United States Patent
Fujii et al.

(10) Patent No.: US 7,772,747 B2
(45) Date of Patent: Aug. 10, 2010

(54) PROCESS FOR PRODUCING A PIEZOELECTRIC FILM, FILM FORMING APPARATUS, AND PIEZOELECTRIC FILM

(75) Inventors: Takamichi Fujii, Kanagawa-ken (JP); Ryuji Tsukamoto, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/409,185

(22) Filed: Mar. 23, 2009

(65) Prior Publication Data
US 2009/0236949 A1    Sep. 24, 2009

(30) Foreign Application Priority Data
Mar. 21, 2008    (JP)    ............... 2008-073032

(51) Int. Cl.
*H01L 41/22* (2006.01)
*H05B 6/00* (2006.01)

(52) U.S. Cl. .................. 310/357; 264/436
(58) Field of Classification Search .......... 310/357; 264/435, 436
See application file for complete search history.

(56) References Cited

U.S. PATENT DOCUMENTS

2006/0197415 A1* 9/2006 Nakashio et al. ............ 310/365
2006/0208039 A1* 9/2006 Denzler et al. ......... 228/180.21
2008/0222865 A1* 9/2008 Nakashio et al. ............ 29/25.35
2009/0058954 A1* 3/2009 Arakawa et al. .............. 347/68
2009/0066763 A1* 3/2009 Fujii et al. .................... 347/68
2009/0223030 A1* 9/2009 Tsukamoto ................ 29/25.35
2009/0225140 A1* 9/2009 Fujii et al. .................... 347/70
2009/0255804 A1* 10/2009 Naono et al. ........... 204/192.18

FOREIGN PATENT DOCUMENTS

| JP | 5206533 A | * | 8/1993 |
| JP | 6-85345 A | | 3/1994 |
| JP | 2005-262108 A | | 9/2005 |

* cited by examiner

*Primary Examiner*—Thomas M Dougherty
(74) *Attorney, Agent, or Firm*—Birch, Stewart, Kolasch & Birch, LLP

(57) ABSTRACT

A piezoelectric film is formed on a substrate by a sputtering technique at a film formation temperature higher than a Curie temperature. An electric field is formed across the piezoelectric film in a direction heading from a surface side of the piezoelectric film toward the substrate side before a temperature of the piezoelectric film having been formed falls to a temperature lower than the Curie temperature, polarization processing being caused to begin by the formation of the electric field across the piezoelectric film. The temperature of the piezoelectric film is allowed to fall to a temperature lower than the Curie temperature in the state in which the electric field is being formed.

7 Claims, 5 Drawing Sheets

PROCESS FOR PRODUCING A PIEZOELECTRIC FILM, FILM FORMING APPARATUS, AND PIEZOELECTRIC FILM

BACKGROUND OF THE INVENTION

1. Field of the Invention

This invention relates to a piezoelectric film. This invention also relates to a process for producing a piezoelectric film. This invention further relates to a film forming apparatus for carrying out the process for producing a piezoelectric film.

2. Description of the Related Art

Piezoelectric devices provided with a piezoelectric body, which has piezoelectric characteristics such that the piezoelectric body expands and contracts in accordance with an increase and a decrease in electric field applied across the piezoelectric body, and electrodes for applying the electric field in a predetermined direction across the piezoelectric body have heretofore been used as actuators to be loaded on ink jet type recording heads, and the like.

As piezoelectric body materials, there have heretofore been known composite oxides having a perovskite structure, such as lead zirconate titanate (PZT). The composite oxides having the perovskite structure are ferroelectric substances, which have spontaneous polarization characteristics at the time free from electric field application. With the conventional piezoelectric devices, ordinarily, an electric field is applied in a direction matched with a polarization axis of the ferroelectric substance, and a piezoelectric effect extending in the direction of the polarization axis is thereby utilized. Specifically, heretofore, it has been regarded to be important that material design be made such that the direction of the electric field application and the direction of the polarization axis may coincide with each other (i.e., polarization axis=direction of electric field application).

Heretofore, in order for the spontaneous polarization of the piezoelectric body to coincide with the direction of the electric field application, polarization processing has been performed on the piezoelectric body. For example, in Japanese Unexamined Patent Publication No. 6(1994)-085345, there is proposed a polarization method for a PZT type piezoelectric device, wherein a high voltage is applied across a piezoelectric body taking on the form of a bulk body, while the piezoelectric body is being heated to a temperature close to a Curie temperature.

Also, for example, in Japanese Unexamined Patent Publication No. 2005-262108, there is proposed a method of forming a piezoelectric film with an aerosol deposition technique (hereinbelow referred to as the AD technique), wherein an electric field is formed within a film forming chamber during film formation, and wherein the polarization processing is thereby performed at the same time as the film formation.

Examples of piezoelectric strains include the following:

(1) an ordinary electric field-induced piezoelectric strain of the ferroelectric substance, which strain is caused by the increase and decrease in applied electric field to undergo the expansion and contraction in the direction of the electric field application in cases where a vector component of a spontaneous polarization axis and the direction of the electric field application coincide with each other, (2) a piezoelectric strain, which is caused to occur when the polarization axis is reversibly rotated by an angle different from 180° due to the increase and decrease in applied electric field, (3) a piezoelectric strain, which is caused to occur in cases where the crystal is caused by the increase and decrease in applied electric field to undergo phase transition, and a volume change occurring due to the phase transition of the crystal is utilized, and (4) a piezoelectric strain, which is caused to occur by the utilization of an engineered domain effect, wherein a large strain is capable of being obtained in cases where a material having characteristics, such that the material is caused by electric field application to undergo phase transition, is utilized, and in cases where a crystal orientation structure is set so as to contain a ferroelectric phase having the crystal orientational characteristics in the direction different from the direction of the spontaneous polarization axis (in cases where the engineered domain effect is utilized, the actuation may be carried out under the conditions under which the phase transition may occur, or under the conditions such that the phase transition may not occur).

In cases where each of the piezoelectric strains (1), (2), (3), and (4) described above is utilized alone, or two or more kinds of the piezoelectric strains (1), (2), (3), and (4) described above are utilized in combination, a desired level of the piezoelectric strain is obtained. Also, as for each of the piezoelectric strains (1), (2), (3), and (4) described above, in cases where the crystal orientation structure in accordance with the principle of the strain generation corresponding to the piezoelectric strain is employed, an enhanced level of the piezoelectric strain is obtained. Therefore, in order for high piezoelectric performance to be obtained, the piezoelectric body should preferably have the crystal orientational characteristics.

However, with the bulk piezoelectric device as described in Japanese Unexamined Patent Publication No. 6(1994)-085345 and with the piezoelectric film obtained from the crystal growth by the AD technique as described in Japanese Unexamined Patent Publication No. 2005-262108, it is not always possible to obtain high crystal orientational characteristics, and it is not always possible to obtain sufficiently high piezoelectric performance even if the polarization processing is performed.

The inventors conducted extensive research on a piezoelectric film having good piezoelectric characteristics. As a result, as for a PZT type piezoelectric film obtained by performing film formation on a substrate by use of a vapor phase growth technique, such as a sputtering technique, the inventors succeeded in obtaining a piezoelectric film having markedly high orientational characteristics, wherein the spontaneous polarization ordinarily heads from the substrate side toward the piezoelectric film surface (in the upward direction), without particular polarization processing immediately after the film formation being performed, depending upon the composition and the dopant material.

In cases where the piezoelectric film described above is to be used as a piezoelectric device, a bottom electrode layer may be formed previously on a substrate, the piezoelectric film may be formed on the bottom electrode layer, and thereafter a top electrode layer may be formed on the piezoelectric film. In the cases of the piezoelectric film described above, the direction of the spontaneous polarization heads from the substrate side (i.e., the bottom electrode side) toward the piezoelectric film surface (i.e., the top electrode side). In order for the piezoelectric film to be actuated as the piezoelectric device (i.e., in order for the piezoelectric effect to be obtained), it is necessary for a voltage to be applied such that an electric field is formed in the direction identical with the direction of the spontaneous polarization. Therefore, in such cases, it may be considered that the bottom electrode is grounded, and that an actuation driver for the negative electrode is used so as to apply the negative voltage to the top electrode side.

However, the actuation driver for the negative electrode is not used widely. Therefore, the problems are encountered in that only a few kinds of the actuation drivers for the negative electrode are available and in that the cost of the actuation driver for the negative electrode is higher than the cost of the actuation driver for the positive electrode. In cases where the bottom electrode is subjected to patterning processing and is taken as the address electrode, and the top electrode is taken as the ground electrode, the actuation driver for the positive electrode, which actuation driver has been used widely, is capable of being utilized. However, in such cases, the production process is not capable of being kept simple.

Therefore, such that the actuation is capable of being performed by use of the actuation driver for the positive electrode, reverse polarization processing for reversing the direction of the polarization has been performed on the piezoelectric film having been formed on the substrate, which piezoelectric film has the high orientational characteristics and having the spontaneous polarization heading from the substrate side toward the piezoelectric film surface. The piezoelectric film has thus been prepared, which piezoelectric film is capable of being actuated such that the substrate side is grounded and such that the piezoelectric film surface side is set at the positive potential. As the method for the polarization processing, the method as described in Japanese Unexamined Patent Publication No. 6(1994)-085345 has been employed, wherein after the piezoelectric film has been formed, the piezoelectric film is taken out into the ambient atmosphere and heated together with the substrate to a temperature in the vicinity of the Curie temperature, and wherein an electric field is applied across the piezoelectric film. However, it has been found that the problems are encountered in that the reverse polarization degree is low, and in that depolarization is apt to occur.

The method described in Japanese Unexamined Patent Publication No. 2005-262108, wherein the electric field is applied at the time of the film formation with the AD technique, is not applicable principally to the cases wherein the film formation is performed with the sputtering technique.

SUMMARY OF THE INVENTION

The primary object of the present invention is to provide a piezoelectric film formed on a substrate, which piezoelectric film has high crystal orientational characteristics and has spontaneous polarization in a direction heading from a piezoelectric film surface side toward the substrate side.

Another object of the present invention is to provide a process for producing the piezoelectric film.

A further object of the present invention is to provide a film forming apparatus for carrying out the process for producing the piezoelectric film.

The present invention provides a process for producing a piezoelectric film, comprising the steps of:

i) forming a piezoelectric film on a substrate by a sputtering technique at a film formation temperature higher than a Curie temperature, ii) forming an electric field across the piezoelectric film in a direction heading from a surface side of the piezoelectric film toward the substrate side before a temperature of the piezoelectric film having been formed falls to a temperature lower than the Curie temperature, polarization processing being caused to begin by the formation of the electric field across the piezoelectric film, and iii) allowing the temperature of the piezoelectric film to fall to a temperature lower than the Curie temperature in the state in which the electric field is being formed.

Specifically, the piezoelectric film having been produced by the process for producing a piezoelectric film in accordance with the present invention is characterized by having a history such that the piezoelectric film has not experienced a reverse polarization direction.

The term "film formation temperature" as used herein means the temperature of the substrate at the time of the film formation (i.e., the temperature of the surface of the substrate on which the piezoelectric film is formed).

As a technique for forming the electric field across the piezoelectric film in the direction heading from the surface side of the piezoelectric film toward the substrate side, one of various techniques may be employed. For example, the electric field may be formed by a negative self-bias voltage occurring at the time at which a radiofrequency voltage is applied across the substrate. Alternatively, the electric field may be formed by a technique for setting the substrate at a minus potential, and setting a plasma space, which is located on the surface side of the substrate, at a potential higher than the minus potential. As another alternative, the electric field may be formed by a technique for setting the substrate at a ground potential or a minus potential, and setting the surface of the piezoelectric film at a plus potential. In such cases, for example, the surface of the piezoelectric film may be set at the plus potential by application of plus ions to the surface of the piezoelectric film.

The present invention also provides a film forming apparatus, comprising:

i) a vacuum chamber, which is adapted for introduction of a film formation gas into it and discharging of the film formation gas from it, ii) a target holder for supporting a target, the target holder being located within the vacuum chamber, iii) a substrate holder for supporting a substrate, on which a film is to be formed, the substrate holder being located so as to stand facing the target holder, and iv) a plasma forming section for forming a plasma space between the target holder and the substrate side, wherein the improvement comprises the provision of:

a) a temperature control section for controlling the temperature of the substrate, and b) an electric field forming section for forming an electric field in a direction heading from a surface side of the film, which is formed on the substrate, toward the substrate side.

The electric field forming section may take on one of various forms. For example, the electric field forming section may be provided with a radiofrequency electric power source for applying a radiofrequency voltage across the substrate. Alternatively, the electric field forming section may be provided with minus potential setting means for setting the substrate at a minus potential. As another alternative, the electric field forming section may be provided with potential setting means for setting the substrate at a ground potential or a minus potential, and plus ion applying means for applying plus ions from the side, which is opposite to the substrate holder, toward the substrate holder side.

The present invention further provides a piezoelectric film obtainable on the substrate by a process for producing a piezoelectric film in accordance with the present invention, wherein the piezoelectric film has spontaneous polarization in the direction heading from the surface of the piezoelectric film toward the substrate side and has a piezoelectric constant of at least 200 pm/V.

The term "piezoelectric constant" as used herein means the piezoelectric constant $d_{31}$, which represents the expansion and contraction in the direction along the electrode surface and which is expressed in terms of the absolute value.

The piezoelectric film in accordance with the present invention should preferably contain a perovskite type oxide that is lead zirconate titanate or is a mixture of lead zirconate titanate and at least one kind of element selected from the group consisting of Nb, W, Ni, and Bi, with the proviso that the perovskite type oxide may contain inevitable impurities.

The process for producing a piezoelectric film in accordance with the present invention comprises the steps of: (i) forming the piezoelectric film on the substrate by the sputtering technique at the film formation temperature higher than the Curie temperature, (ii) forming the electric field across the piezoelectric film in the direction heading from the surface side of the piezoelectric film toward the substrate side before the temperature of the piezoelectric film having been formed falls to the temperature lower than the Curie temperature, polarization processing being caused to begin by the formation of the electric field across the piezoelectric film, and (iii) allowing the temperature of the piezoelectric film to fall to the temperature lower than the Curie temperature in the state in which the electric field is being formed. Therefore, with the process for producing a piezoelectric film in accordance with the present invention, the piezoelectric film, which has the high crystal orientational characteristics and has the spontaneous polarization in the direction heading from the piezoelectric film surface side toward the substrate side, is obtained. The piezoelectric film having been produced by the process for producing a piezoelectric film in accordance with the present invention has the history such that the piezoelectric film has not experienced the reverse polarization direction. Therefore, the piezoelectric film is hardly susceptible to the depolarization and has the high piezoelectric characteristics.

The film forming apparatus in accordance with the present invention comprises: (i) the vacuum chamber, which is adapted for the introduction of the film formation gas into it and the discharging of the film formation gas from it, (ii) the target holder for supporting the target, the target holder being located within the vacuum chamber, (iii) the substrate holder for supporting the substrate, on which the film is to be formed, the substrate holder being located so as to stand facing the target holder, and (iv) the plasma forming section for forming the plasma space between the target holder and the substrate side, wherein the improvement comprises the provision of: (a) the temperature control section for controlling the temperature of the substrate, and (b) the electric field forming section for forming the electric field in the direction heading from the surface side of the film, which is formed on the substrate, toward the substrate side. Therefore, with the film forming apparatus in accordance with the present invention, subsequently to the formation of the piezoelectric film, the polarization processing is begun without the temperature of the piezoelectric film being lowered. The film forming apparatus in accordance with the present invention is thus appropriate for the process for producing a piezoelectric film in accordance with the present invention.

The piezoelectric film in accordance with the present invention is obtainable by the process for producing a piezoelectric film in accordance with the present invention. Therefore, the piezoelectric film in accordance with the present invention has the high crystal orientational characteristics and has the spontaneous polarization in the direction heading from the surface of the piezoelectric film toward the substrate side. Also, the piezoelectric film in accordance with the present invention has the history such that the piezoelectric film has not experienced the reverse polarization direction. Therefore, the piezoelectric film is hardly susceptible to the depolarization and has the high piezoelectric characteristics. Particularly, the piezoelectric film having the piezoelectric constant of at least 200 pm/V is useful for the use applications, such as piezoelectric actuators.

DESCRIPTION OF THE PREFERRED EMBODIMENTS

The present invention will hereinbelow be described in further detail with reference to the accompanying drawings.

The process for producing a piezoelectric film in accordance with the present invention comprises the steps of: (i) forming the piezoelectric film on the substrate by the sputtering technique at the film formation temperature higher than the Curie temperature (the film formation step), (ii) forming the electric field across the piezoelectric film in the direction heading from the surface side of the piezoelectric film toward the substrate side before the temperature of the piezoelectric film having been formed falls to the temperature lower than the Curie temperature, polarization processing being caused to begin by the formation of the electric field across the piezoelectric film, and (iii) allowing the temperature of the piezoelectric film to fall to the temperature lower than the Curie temperature in the state in which the electric field is being formed (the polarization step). Therefore, with the process for producing a piezoelectric film in accordance with the present invention, the piezoelectric film, which has the high crystal orientational characteristics and has the spontaneous polarization in the direction heading from the piezoelectric film surface side toward the substrate side, is obtained.

<A First Embodiment of the Process for Producing a Piezoelectric Film and a First Embodiment of the Film Forming Apparatus for Carrying Out the Process>

Figure 1:
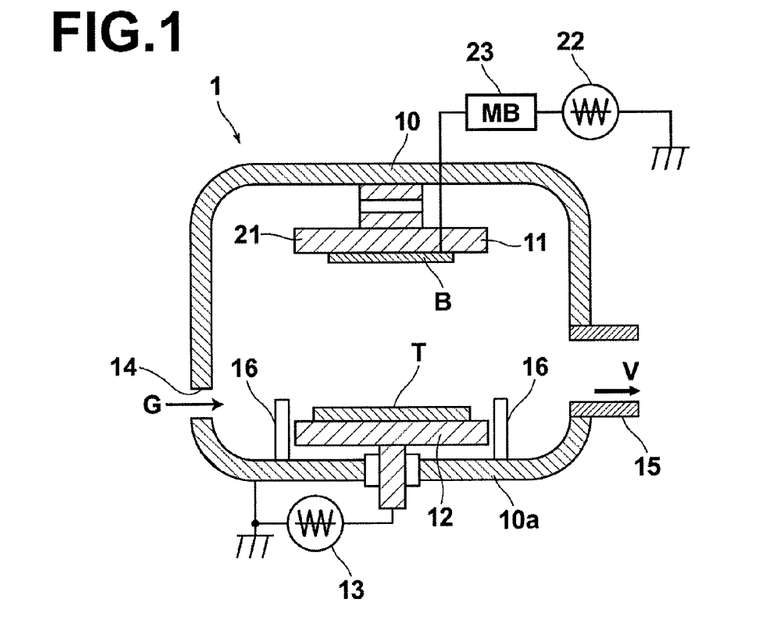
FIG. 1 is a schematic sectional view showing a first embodiment of the film forming apparatus for carrying out the first embodiment of the process for producing a piezoelectric film in accordance with the present invention.
Figure 2:
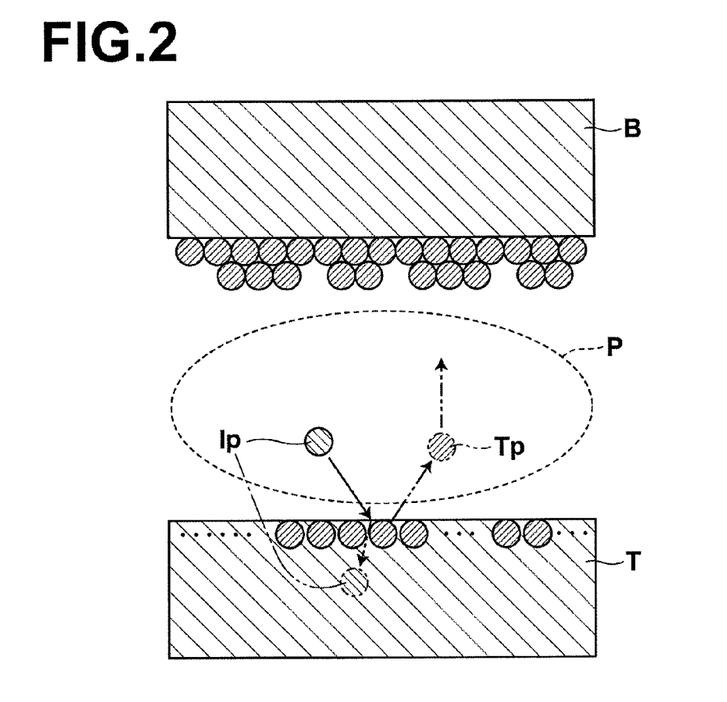
FIG. 2 is an explanatory view showing how a piezoelectric film is formed by the first embodiment of the process for producing a piezoelectric film in accordance with the present invention.
Figure 3:
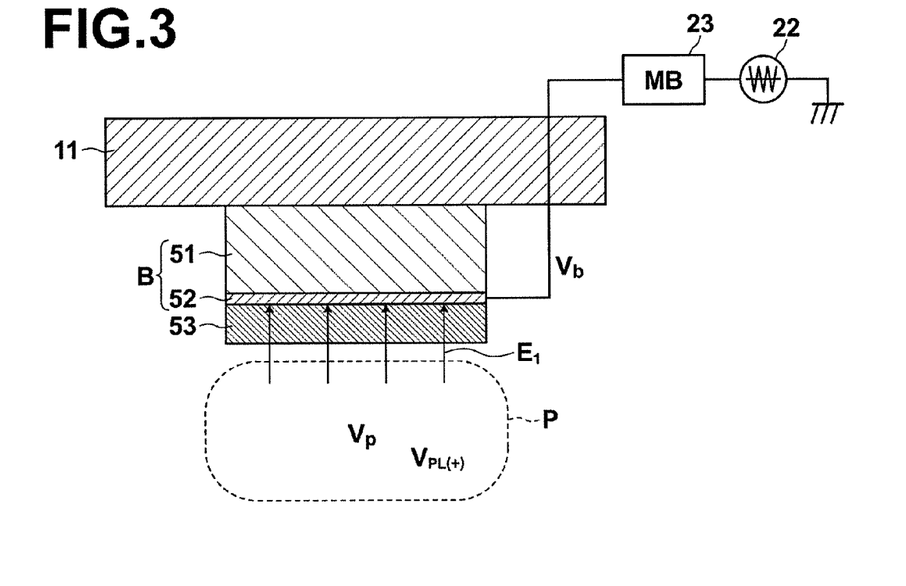
FIG. 3 is an explanatory view showing how polarization processing is performed by the first embodiment of the process for producing a piezoelectric film in accordance with the present invention.

A first embodiment of the process for producing a piezoelectric film in accordance with the present invention and a first embodiment of the film forming apparatus for carrying out the process in accordance with the present invention will be described hereinbelow with reference to FIGS. 1, 2, and 3. FIG. 1 is a schematic sectional view showing a first embodiment of the film forming apparatus for carrying out the first embodiment of the process for producing a piezoelectric film in accordance with the present invention. FIG. 2 is an explanatory view showing how a piezoelectric film is formed by the first embodiment of the process for producing a piezoelectric film in accordance with the present invention. FIG. 3 is an explanatory view showing how polarization processing is performed by the first embodiment of the process for producing a piezoelectric film in accordance with the present invention.

As illustrated in FIG. 1, a film forming apparatus 1, which is the first embodiment of the film forming apparatus for carrying out the first embodiment of the process for producing a piezoelectric film in accordance with the present invention, is approximately constituted of a substrate holder 11, such as an electrostatic chuck, a plasma electrode (a cathode electrode) 12 for forming a plasma, and a vacuum chamber 10, in which the substrate holder 11 and the plasma electrode 12 are accommodated. The substrate holder 11 supports a substrate (a film formation substrate) B and is provided therein with a heater 21, which is capable of heating the substrate B to a predetermined temperature. The plasma electrode 12 acts to generate plasma. The plasma electrode 12 corresponds to a target holder for supporting a target T. The heater 21 provided at the substrate holder 11 acts as heating means for heating the substrate B to the predetermined temperature and constitutes the temperature control section for adjusting the substrate temperature. The temperature control section may further be provided with cooling means, a thermometer (a thermocouple), and the like. The heating means may be of a direct heating type using a heater wire or may be of a lamp heating type. The temperature of the substrate surface may be measured directly by an infrared radiation meter. Alternatively, the temperature of the substrate surface may be measured by a thermocouple having been fitted previously to the substrate, temperature calibration may be made with a setting value of the heater or the temperature of the thermocouple fitted to the heater, and the value obtained from the temperature calibration may be utilized. The cooling means may be of a natural cooling type or may be of a forced cooling type, such as air cooling or water cooling. Also, the natural cooling and the temperature heating may be combined, and the cooling may be performed through temporal control. In this embodiment, by way of example, the substrate B is heated by use of the lamp heater, and the temperature value, which is obtained from the calibration with the previously measured substrate surface temperature and the temperature of the thermocouple located at the substrate holder 11, is utilized. Also, in this embodiment, by way of example, the cooling means of the natural cooling type is employed.

The substrate holder 11 and the plasma electrode 12 are located at a spacing from each other so as to stand facing each other. Also, a target T, which has a composition in accordance with the composition of the film to be formed, is located on the plasma electrode 12. The plasma electrode 12 is connected to a radiofrequency electric power source 13. The plasma electrode 12 and the radiofrequency electric power source 13 together constitute a plasma forming section.

The vacuum chamber 10 is provided with a gas introducing aperture 14, through which a gas (film formation gas) G necessary for the film formation is to be introduced into the vacuum chamber 10. The vacuum chamber 10 is also provided with a gas exhaust pipe 15, through which an exhaust gas V is to be taken out from the vacuum chamber 10. As the gas G, an Ar gas, an $Ar/O_2$ mixed gas, or the like, is utilized. The vacuum chamber 10 is grounded.

Further, the film forming apparatus 1 is provided with a second radiofrequency electric power source 22, which applies a radiofrequency AC voltage across the substrate B, and a matching box 23. The second radiofrequency electric power source 22 is constituted of the plasma forming radiofrequency electric power source device of the same type as the radiofrequency electric power source 13. The matching box 23 cancels a reactance component of a load and thereby performs impedance matching between the load and the second radiofrequency electric power source 22. For example, the matching box 23 may be constituted of a blocking capacitor for cutting off the DC component and transmitting only the AC component. The second radiofrequency electric power source 22 and the matching box 23 together constitute an electric field forming section.

As for the application of the AC voltage across the substrate B, the substrate holder 11 may be utilized as an electrode, and the AC voltage may thus be applied across the substrate B. Alternatively, the AC voltage may be applied directly to a bottom electrode of an Si substrate. In this embodiment, by way of example, the AC voltage is applied to the rear surface of the substrate holder 11 via a voltage introducing terminal.

A ground shield, i.e. a grounding member 16, stands on a bottom surface 10a of the vacuum chamber 10 so as to surround the plasma electrode 12. The grounding member 16 acts to prevent electrical discharge from occurring from the plasma electrode 12 laterally or downwardly toward the vacuum chamber 10.

As illustrated in FIG. 2, at the time of the film formation, the radiofrequency AC voltage is applied by the radiofrequency electric power source 13 to the plasma electrode 12. The vacuum chamber 10 and the plasma electrode 12 act as the anode and the cathode, respectively, and the electrical discharge occurs between the vacuum chamber 10 and the plasma electrode 12. The gas G having been introduced into the vacuum chamber 10 is thus converted into the plasma, and a plus ion Ip, such as an Ar ion, is thereby produced. The plus ion Ip having thus been produced sputters the target T. A constituent element Tp of the target T having thus been sputtered by the plus ion Ip is released from the target T and is deposited on the substrate B in a neutral state or in an ionized state. The deposition is performed for a predetermined period of time, and the film having a predetermined thickness is thus formed. In FIG. 2, a reference letter P represents a plasma space.

[Film Formation Step]

As illustrated in FIG. 3, the substrate B supported by the substrate holder 11 comprises, for example, a substrate 51, in which a pressurizing liquid chamber of a head has been formed, and a bottom electrode 52 having been formed on the substrate 51. A piezoelectric film 53 is formed on the substrate B by the sputtering technique.

Examples of the factors, which have the effects upon the characteristics of the film formed by the sputtering technique, may include the film formation temperature, the kind of the substrate, the composition of a primary coat in cases where a film has been formed previously on the substrate, the surface energy of the substrate, the film formation pressure, the oxygen quantity in the ambient gas, the loaded electrode, the substrate-target distance, the electron temperature and the electron density in the plasma, the active moiety density in the plasma, and the service life of the active moiety.

The inventors have conducted extensive research on factors having large effects upon the characteristics of the formed film among various film formation factors and have found film formation conditions enabling a film having good quality to be formed. (Reference may be made to Japanese Patent Application Nos. 2006-263978, 2006-263979, and 2006-263980, which have been previously filed by the inventors, and which have not yet been published at the time of the filing of the present application.)

Specifically, the inventors have found that the film having good quality is formed in cases where two factors, i.e. a film formation temperature Ts (° C.) and a factor selected from the group consisting of a difference Vs−Vf (V), wherein Vs (V) represents the plasma potential in the plasma at the time of the film formation, and wherein Vf (V) represents the floating potential, the plasma potential Vs (V), and a substrate-target spacing distance D (mm) are optimized. More specifically, the inventors have found that, in cases where the film characteristics are plotted on a graph, in which the horizontal axis represents the film formation temperature Ts (° C.), and in which the vertical axis represents the factor selected from the group consisting of the difference Vs−Vf (V), the plasma potential Vs (V), and the substrate-target spacing distance D (mm), a film having good quality is formed within a certain range (i.e., under the conditions described later). The film formation temperature Ts (° C.) takes a value higher than the Curie temperature of the piezoelectric film to be formed.

(First Film Formation Conditions)

The first film formation conditions specify the optimization of the film formation temperature Ts (° C.) and the difference Vs−Vf (V). Specifically, the film formation should preferably be performed under the film formation conditions satisfying Formulas (1) and (2) shown below, and should more preferably be performed under the film formation conditions satisfying Formulas (1), (2), and (3) shown below:

$$Ts(°C.) \geq 400 \tag{1}$$

$$-0.2Ts+100 < Vs-Vf(V) < -0.2Ts+130 \tag{2}$$

$$10 \leq Vs-Vf(V) < 35 \tag{3},$$

wherein Ts (° C.) represents the film formation temperature, and Vs−Vf (V) represents the difference between the plasma potential Vs (V) in the plasma at the time of the film formation and the floating potential Vf (V).

(Second Film Formation Conditions)

The second film formation conditions specify the optimization of the film formation temperature Ts (° C.) and the spacing distance D (mm) between the substrate B and the target T (i.e., the substrate-target spacing distance). Specifically, the film formation should preferably be performed under the film formation conditions satisfying Formulas (4) and (5) shown below, or under the film formation conditions satisfying Formulas (6) and (7) shown below:

$$400 \leq Ts(°C.) \leq 500 \tag{4}$$

$$30 \leq D(mm) \leq 80 \tag{5}$$

$$500 \leq Ts(°C.) \leq 600 \tag{6}$$

$$30 \leq D(mm) \leq 100 \tag{7},$$

wherein Ts (° C.) represents the film formation temperature, and D (mm) represents the spacing distance between the substrate and the target.

(Third Film Formation Conditions)

The third film formation conditions specify the optimization of the film formation temperature Ts (° C.) and the plasma potential Vs (V) in the plasma at the time of the film formation. Specifically, the film formation should preferably be performed under the film formation conditions satisfying Formulas (8) and (9) shown below, or under the film formation conditions satisfying Formulas (10) and (11) shown below:

$$400 \leq Ts(°C.) \leq 475 \tag{8}$$

$$20 \leq Vs(V) \leq 50 \tag{9}$$

$$475 \leq Ts(°C.) \leq 600 \tag{10}$$

$$Vs(V) \leq 40 \tag{11},$$

wherein Ts (° C.) represents the film formation temperature, and Vs (V) represents the plasma potential in the plasma at the time of the film formation.

For example, in cases where the piezoelectric film containing a perovskite type oxide that is represented by General Formula (P-1) or (P-2) shown below is formed under the conditions satisfying the first film formation conditions, the second film formation conditions, or the third film formation conditions described above, the piezoelectric film having high orientational characteristics is obtained:

$$Pb_a(Zr_{b1}Ti_{b2}X_{b3})O_3 \tag{P-1}$$

wherein X represents at least one kind of metallic element selected from the group consisting of Nb, W, Ni, and Bi,
a>0,
b1>0,
b2>0, and
b3≧0,
the standard composition being such that a=1.0, and at the same time b1+b2+b3=1.0, with the proviso that each of the value of a and the value of b1+b2+b3 may deviate from 1.0 within a range such that the perovskite structure is capable of being attained, $$(Pb_aX_{a1})(Zr_{b1}Ti_{b2})O_3 \tag{P-2}$$

wherein X represents at least one kind of metallic element selected from the group consisting of La, Bi, and W,
a>0,
a1≧0,
b1>0, and
b2>0,
the standard composition being such that a+a1=1.0, and at the same time b1+b2=1.0, with the proviso that each of the value of a+a1 and the value of b1+b2 may deviate from 1.0 within a range such that the perovskite structure is capable of being attained.

The value of the difference Vs−Vf (V) may be altered by, for example, locating a grounding conductor between the substrate and the target. In cases where a film forming apparatus described in Japanese Patent Application No. 2006-263981, which has been previously filed by the inventors (and which has not yet been published at the time of the filing of the present application), is utilized, the potential of the plasma space is capable of being adjusted in a simple manner. The film forming apparatus described in Japanese Patent Application No. 2006-263981 is constituted such that a shield is located so as to surround the outer periphery of the target holder, which supports the target, on the film formation substrate side, and such that the state of the potential of the plasma space is capable of being adjusted by the presence of the shield.

[Polarization Step]

The polarization step is performed within the vacuum chamber 10 of the film forming apparatus 1. Specifically, after the film formation step has been performed, the radiofrequency electric power source 13 of the plasma forming section is turned off. Also, the substrate B, on which the piezoelectric film 53 has been formed, is kept in the state supported by the substrate holder 11, and the polarization step is begun before the temperature of the substrate B falls to a value lower than a Curie temperature Tc.

The polarization step is begun by an operation, wherein the second radiofrequency electric power source 22 is turned on, and wherein a radiofrequency AC voltage (hereinbelow referred to as the radiofrequency voltage) is thus applied to the bottom electrode layer 52 on the substrate 51 via the matching box 23. As a result of the application of the radiofrequency voltage, electrical discharge occurs in the space around the substrate B. In this case, the vacuum chamber 10, which is grounded, and the bottom electrode layer 52 acts as the anode and the cathode, respectively. Also, the blocking capacitor of the matching box 23 is connected in series with the plasma load between the anode and the cathode, and the cathode is in a floating state in terms of the direct current. When the radiofrequency voltage is applied by the second radiofrequency electric power source 22, glow discharge occurs, and the plasma is formed. At this time, a plasma potential Vp, which is the positive potential with respect to the ground potential, arises in the plasma space, and a negative potential Vb with respect to the ground potential is generated at the cathode by the self-bias effect. As a result, a large difference in potential occurs between the anode and the cathode, particularly between the bottom electrode layer 52, which acts as the anode, and the plasma space (gas phase space). An electric field $E_1$ due to the difference in potential is formed in the direction heading from the plasma space toward the bottom electrode layer 52, i.e. in the direction heading from the surface of the piezoelectric film toward the substrate B.

In the state in which the electric field $E_1$ is being formed, the temperature of the substrate B is allowed to fall from the film formation temperature Ts to a temperature Tb (<Tc) lower than the Curie temperature Tc. The temperature Tb should preferably be set at a temperature lower by at least approximately 30° C. than the Curie temperature, and should more preferably be set at a temperature lower by at least approximately 50° C. than the Curie temperature. Thereafter, the radiofrequency electric power applied across the substrate B is turned off, and the substrate temperature is returned to the room temperature. In cases where the substrate temperature is allowed to fall, natural cooling may be performed. Alternatively, the temperature control section of the substrate holder 11 may be provided with cooling means for performing forced cooling. However, if the cooling is performed at a markedly high temperature fall rate, there is the risk that the direction of the spontaneous polarization will not be kept uniform sufficiently. Therefore, the cooling should preferably be performed little by little.

The piezoelectric film formed in the manner described above has the high crystal orientational degree and has the spontaneous polarization in the direction heading from the piezoelectric film surface side toward the substrate side.

<A Second Embodiment of the Process for Producing a Piezoelectric Film and a Second Embodiment of the Film Forming Apparatus for Carrying Out the Process>

Figure 4:
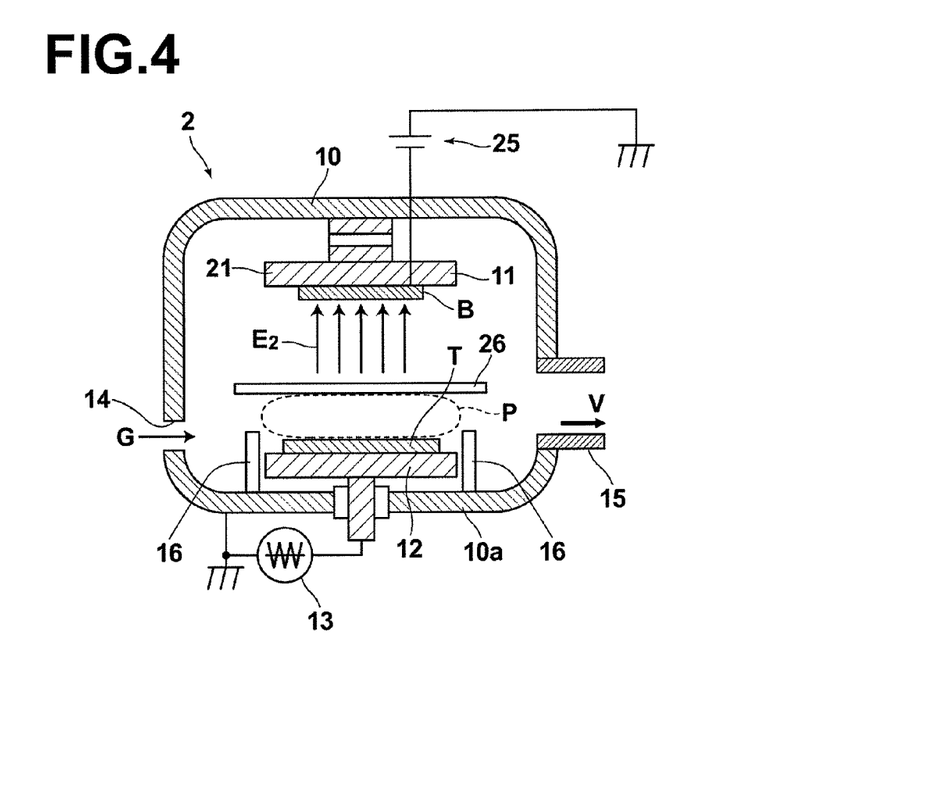
FIG. 4 is a schematic sectional view showing a second embodiment of the film forming apparatus for carrying out the second embodiment of the process for producing a piezoelectric film in accordance with the present invention.

A second embodiment of the process for producing a piezoelectric film in accordance with the present invention and a second embodiment of the film forming apparatus for carrying out the process in accordance with the present invention will be described hereinbelow with reference to FIG. 4. FIG. 4 is a schematic sectional view showing a second embodiment of the film forming apparatus for carrying out the second embodiment of the process for producing a piezoelectric film in accordance with the present invention. In FIG. 4, similar elements are numbered with the same reference numerals with respect to FIG. 1.

With reference to FIG. 4, a film forming apparatus 2, which is the second embodiment of the process for producing a piezoelectric film in accordance with the present invention, is constituted basically in the same manner as that for the first embodiment of the film forming apparatus 1, except for the constitution of the electric field forming section. Specifically, the film forming apparatus 2 is not provided with the second radiofrequency electric power source 22 and the matching box 23 of the film forming apparatus 1. Also, the film forming apparatus 2 is provided with an electric power source 25 for setting the substrate B at a minus potential, and a shutter 26 for movement into and out of the region between the substrate holder 11 and the plasma electrode 12 acting as the target holder. In the second embodiment, the electric power source 25, and the combination of the radiofrequency electric power source 13 and the plasma electrode 12 together constitute the electric field forming section.

The second embodiment of the process for producing a piezoelectric film in accordance with the present invention, wherein the film forming apparatus 2 is employed, will be described hereinbelow. The film formation step is performed in the same manner as that in the first embodiment of the process for producing a piezoelectric film in accordance with the present invention. In the second embodiment, the film formation step is performed in the state in which the shutter 26 is retracted from the region above the target T (in the same state as that shown in FIG. 1). In the second embodiment, the polarization step is performed such that the electric field is formed in a manner different from that in the first embodiment.

Specifically, after the piezoelectric film 53 has been formed in the same manner as that in the first embodiment, the substrate temperature is kept at a temperature higher than the Curie temperature, and the radiofrequency electric power source 13 of the plasma forming section is turned off. The shutter 26 is inserted into the region between target T and the substrate B and is located above the target T. The electric power source 25 is then turned on, and the substrate B (specifically, the bottom electrode) is thus set at the negative potential.

Thereafter, the radiofrequency electric power source 13 of the plasma forming section is turned on for applying the radiofrequency electric power, and the plasma is again formed. The shutter 26 is located for preventing the constituent element Tp of the target T, which has been sputtered by the plus ion Ip formed in the plasma space, from impinging upon the surface of the piezoelectric film 53 on the substrate B. The potential of the plasma space between the substrate B and the shutter 26 is lower than the potential formed in cases where the shutter 26 is not present. However, the potential of the plasma space between the substrate B and the shutter 26 is set at a positive potential by the plasma coming from the edge of the shutter 26. At this time, since the substrate B is set at the negative potential, an electric field $E_2$ is formed in the direction heading from the plasma space toward the substrate B, i.e. in the direction heading from the surface of the piezoelectric film toward the substrate side.

In the state in which the electric field $E_2$ is being formed, the temperature of the substrate B is allowed to fall to a temperature Tb (<Tc) lower than the Curie temperature Tc. Thereafter, the voltage applied across the substrate B and the radiofrequency voltage applied to the target side are turned off, and the substrate temperature is returned to the room temperature.

The piezoelectric film 53 formed in the manner described above has the high crystal orientational degree and has the spontaneous polarization in the direction heading from the piezoelectric film surface side toward the substrate side.

<A Third Embodiment of the Process for Producing a Piezoelectric Film and a Third Embodiment of the Film Forming Apparatus for Carrying Out the Process>

Figure 5:
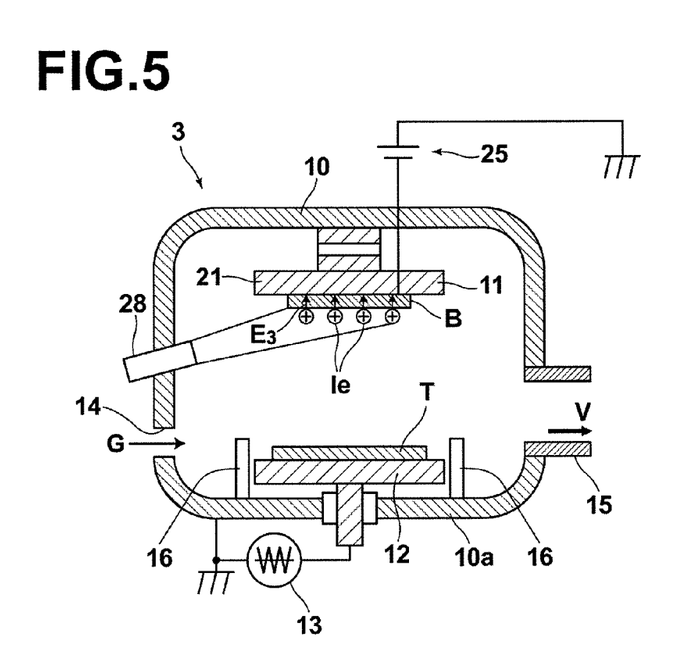
FIG. 5 is a schematic sectional view showing a third embodiment of the film forming apparatus for carrying out the third embodiment of the process for producing a piezoelectric film in accordance with the present invention.

A third embodiment of the process for producing a piezoelectric film in accordance with the present invention and a third embodiment of the film forming apparatus for carrying out the process in accordance with the present invention will be described hereinbelow with reference to FIG. 5. FIG. 5 is a schematic sectional view showing a third embodiment of the film forming apparatus for carrying out the third embodiment of the process for producing a piezoelectric film in accordance with the present invention. In FIG. 5, similar elements are numbered with the same reference numerals with respect to FIG. 1 and FIG. 4.

With reference to FIG. 5, a film forming apparatus 3, which is the third embodiment of the process for producing a piezoelectric film in accordance with the present invention, is constituted basically in the same manner as that for the second embodiment of the film forming apparatus 2, except for the constitution of the electric field forming section. Specifically, as in the second embodiment of the film forming apparatus 2, the film forming apparatus 3 is provided with the electric power source 25 for setting the substrate B at the minus potential. The film forming apparatus 3 is also provided with an ion source 28 for applying positive ions Ie to the surface of the piezoelectric film. In the third embodiment, the electric power source 25 and the ion source 28 together constitute the electric field forming section.

The ion source 28 may be of any kind of ion source. For example, the ion source 28 may be selected from a radiofrequency type, a microwave type, a penning ionization gauge (PIG) type, an electron bombardment type, and a low voltage arc discharge type. Alternatively, the ion source 28 may be a plasma source for applying the positive ions together with neutral particles, radicals, and the like. It is necessary for the ion source 28 to apply the positive ions such that the positive ions impinge upon the surface of the piezoelectric film. The kind of the positive ions applied is not limited to a specific kind and should preferably be the positive ions of an inert gas. In the third embodiment, the film forming apparatus 3 is provided with the ion source for applying the argon (Ar) ions.

The third embodiment of the process for producing a piezoelectric film in accordance with the present invention, wherein the film forming apparatus 3 is employed, will be described hereinbelow. The film formation step is performed in the same manner as that in the first embodiment of the process for producing a piezoelectric film in accordance with the present invention. In the third embodiment, the polarization step is performed such that the electric field is formed in a manner different from that in the first embodiment and that in the second embodiment.

Specifically, after the piezoelectric film 53 has been formed in the same manner as that in the first embodiment, the substrate temperature is kept at a temperature higher than the Curie temperature, and the radiofrequency electric power source 13 of the plasma forming section is turned off. Thereafter, the Ar ions are applied from the ion source 28 toward the surface of the piezoelectric film 53. Also, the electric power source 25 is turned on, and the substrate B is thus set at the negative potential. As a result, an electric field $E_3$ is formed in the direction heading from the surface of the piezoelectric film toward the substrate side.

In the state in which the electric field $E_3$ is being formed, the temperature of the substrate B is allowed to fall to a temperature Tb (<Tc) lower than the Curie temperature Tc. Thereafter, the ion application by the ion source 28 is turned off. Also, the voltage applied across the substrate B and the radiofrequency voltage applied to the target side are turned off, and the substrate temperature is returned to the room temperature.

The piezoelectric film 53 formed in the manner described above has the high crystal orientational degree and has the spontaneous polarization in the direction heading from the piezoelectric film surface side toward the substrate side.

[Piezoelectric Device and Ink Jet Type Recording Head]

Figure 6:
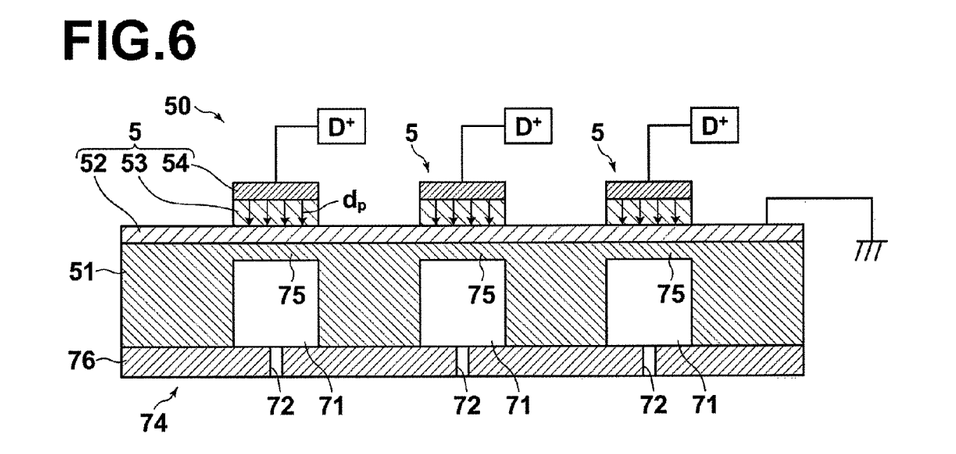
FIG. 6 is a sectional view showing a piezoelectric device, which utilizes a piezoelectric film in accordance with the present invention, and a major part of an ink jet type recording head (a liquid discharge apparatus) provided with the piezoelectric device.

A piezoelectric device 5, which utilizes a piezoelectric film in accordance with the present invention, and an ink jet type recording head (acting as a liquid discharge apparatus), which is provided with the piezoelectric device 5, will be described hereinbelow with reference to FIG. 6. FIG. 6 is a sectional view showing a piezoelectric device, which utilizes a piezoelectric film in accordance with the present invention, and a major part of an ink jet type recording head (a liquid discharge apparatus) provided with the piezoelectric device. In FIG. 6, for clearness, reduced scales of constituent elements of the ink jet type recording head are varied from actual reduced scales.

With reference to FIG. 6, an ink jet type recording head (acting as the liquid discharge apparatus) 50 comprises a nozzle (acting as the liquid discharging member) 74. The nozzle 74 is provided with a plurality of pressurizing liquid chambers 71, 71, . . . , in which an ink composition is to be stored. The nozzle 74 is also provided with a plurality of liquid discharge openings 72, 72, . . . , through which the ink composition is to be discharged from the pressurizing liquid chambers 71, 71, . . . to the exterior of the pressurizing liquid chambers 71, 71, . . . . The ink jet type recording head 50 also comprises a plurality of the piezoelectric devices 5, 5, . . . , each of which is located so as to correspond to one of the pressurizing liquid chambers 71, 71, . . . of the nozzle 74. The ink jet type recording head 50 further comprises a plurality of vibrating plates (diaphragms) 75, 75, . . . , each of which constitutes a top wall surface of one of the pressurizing liquid chambers 71, 71, . . . and transmits the expansion and the contraction of the corresponding piezoelectric device 5 to the corresponding pressurizing liquid chamber 71.

In this case, the nozzle 74 is constituted such that the pressurizing liquid chambers 71, 71, . . . are formed in the substrate 51 by dry etching processing or wet etching processing, and such that a thin plate 76 provided with the liquid discharge openings 72, 72, . . . is fitted to the substrate 51. Each of the vibrating plates 75, 75, . . . is constituted by the processing of the substrate 51 so as to form one wall of the corresponding pressurizing liquid chamber 71. Each of the piezoelectric devices 5, 5, . . . is formed on one of the vibrating plates 75, 75, . . . .

The piezoelectric device 5 comprises a bottom electrode layer 52, a piezoelectric film 53, and a top electrode layer 54, which are overlaid in this order on the vibrating plate 75. An electric field is applied across the piezoelectric film 53 in the direction of the thickness of the piezoelectric film 53 by bottom electrode layer 52 and the top electrode layer 54.

The ink jet type recording head 50 is constituted such that each of the piezoelectric devices 5, 5, . . . is expanded or contracted through alteration of the electric field applied across each of the piezoelectric devices 5, 5, . . . , such that the expansion or the contraction of each of the piezoelectric devices 5, 5, . . . is transferred by the corresponding vibrating plate 75 to the corresponding pressurizing liquid chamber 71, and such that the discharge of the ink composition from the pressurizing liquid chamber 71 and the control of the quantity of the ink composition discharged from the pressurizing liquid chamber 71 are thereby performed. Specifically, the piezoelectric actuator is constituted of the piezoelectric device 5 and the vibrating plate 75.

As the substrate 51, a silicon substrate is preferable for its high thermal conductivity and good processability. The substrate 51 should more preferably be constituted of a laminate substrate, such as an SOI substrate comprising an $SiO_2$ film and an Si active layer overlaid successively on a silicon substrate. Also, a buffer layer for enhancing the lattice matching characteristics, an adhesion layer for enhancing the adhesion of the electrode and the substrate to each other, or the like, may be formed between the vibrating plate 75 and the bottom electrode layer 52.

The substrate 51, in which the pressurizing liquid chamber 71 is formed, and the vibrating plate 75 may be combined into an integral body or may be formed as the two independent members. In cases where substrate 51 and the vibrating plate 75 are formed as the two independent members, the substrate 51 may be constituted of silicon, glass, stainless steel (SUS), yttrium stabilized zirconia (YSZ), alumina, sapphire, or silicon carbide.

In this embodiment, the piezoelectric film 53 has spontaneous polarization $d_p$ such that the minus side of the spontaneous polarization $d_p$ is located on the side of the top electrode layer 54, and such that the plus side of the spontaneous polarization $d_p$ is located on the side of the bottom electrode layer 52 (i.e., the direction of the spontaneous polarization is the downward direction). Also, the bottom electrode layer 52 constitutes a ground (GND) electrode at which the applied voltage is fixed, and the top electrode layer 54 constitutes an address electrode at which the applied voltage is altered. Each of the piezoelectric devices 5, 5, . . . is provided with a positive voltage actuation driver $D^+$ for performing the actuation control for altering the voltage applied across the top electrode layer 54.

No limitation is imposed upon a principal constituent of the bottom electrode layer 52. Examples of the principal constituents of the bottom electrode layer 52 include metals, such as Ir, Au, and Pt; metal oxides, such as $IrO_2$, $RuO_2$, $LaNiO_3$, and $SrRuO_3$; and combinations of the above-enumerated metals and/or the above-enumerated metal oxides. No limitation is imposed upon the thickness of the bottom electrode layer 52 and the thickness of each of the top electrode layers 54, 54, . . . . For example, the thickness of the bottom electrode layer 52 and the thickness of each of the top electrode layers 54, 54, . . . should preferably fall within the range of 50 nm to 500 nm.

Also, no limitation is imposed upon a principal constituent of the top electrode layers 54, 54, . . . . Examples of the principal constituents of the top electrode layers 54, 54, . . . include the materials exemplified above for the bottom electrode layer 52; electrode materials ordinarily utilized in semiconductor processes, such as Al, Ta, Cr, and Cu; and combinations of the materials exemplified above for the bottom electrode layer 52 and/or the above-enumerated electrode materials.

No limitation is imposed upon the thickness of the piezoelectric film 53. The thickness of the piezoelectric film 53 may ordinarily be at least 1 μm and may fall within the range of, for example, 1 μm to 10 μm.

Also, as the piezoelectric film 53, the piezoelectric film having been produced by the process for producing a piezoelectric film in accordance with the present invention (e.g., the first embodiment of the process for producing a piezoelectric film in accordance with the present invention) is employed. In this case, particularly, the piezoelectric film having a piezoelectric constant of at least 200 pm/V at the room temperature is employed.

An example of a process for producing the ink jet type recording head described above will be described hereinbelow.

Firstly, the pressurizing liquid chambers 71, 71, . . . are formed in the substrate 51 by the etching processing. Also, the surface constituting one wall of each of the pressurizing liquid chambers 71, 71, . . . of the substrate 51 is processed so as to form the vibrating plate 75. The substrate 51 is then fitted to the thin plate 76 provided with the liquid discharge openings 72, 72, . . . is fitted to the substrate 51. Thereafter, the bottom electrode layer 52 is formed on the substrate 51. When necessary, before the bottom electrode layer 52 is formed, the buffer layer, the adhesion layer, or the like, may be formed on the substrate 51. The thus obtained substrate 51 is taken as the substrate B, and the piezoelectric film 53 is formed on the bottom electrode layer 52 and subjected to the polarization processing by, for example, the aforesaid first embodiment of the process for producing a piezoelectric film in accordance with the present invention. Thereafter, the top electrode layer 54 is formed on the piezoelectric film 53, and the actuation driver and the necessary wiring are formed.

The piezoelectric film 53 having been formed by the aforesaid embodiment of the process for producing a piezoelectric film in accordance with the present invention has the spontaneous polarization $d_p$ in the direction heading from the side of the top electrode layer 54 (i.e., from the piezoelectric film surface side) toward the bottom electrode layer 52 (i.e., toward the substrate side) and has the high crystal orientational characteristics. Therefore, by the positive voltage actuation with the top electrode layer 54 taken as the address electrode, the expansion and the contraction accompanying the alteration in applied electric field arise efficiently, and the piezoelectric effect due to the electric field induced strain is obtained efficiently.

EXAMPLES

The present invention will further be illustrated by the following non-limitative examples.

Example 1

In Example 1, a piezoelectric device provided with a piezoelectric film having been produced by the first embodiment of the process for producing a piezoelectric film in accordance with the present invention and the first embodiment of the film forming apparatus in accordance with the present invention was prepared.

An Si substrate 51, in which a pressurizing liquid chamber had been formed and in which the diaphragm structure (i.e., the vibrating plate structure) had been formed, was prepared previously. Also, an Ti layer having a thickness of 10 nm and an Ir layer having a thickness of 150 nm were formed as a bottom electrode layer 52 on the vibrating plate 75. The thus obtained substrate was taken as the substrate B in the first embodiment, and the piezoelectric film was produced on the substrate B (i.e., on the bottom electrode layer 52) by the first embodiment of the process for producing a piezoelectric film in accordance with the present invention and the first embodiment of the film forming apparatus in accordance with the present invention.

A target T having a composition of $Pb_{1.3}Zr_{0.52}Ti_{0.48}$+Nb (hereinbelow referred to as the Nb-PZT) was used, and an Nb-PZT film 53 was formed to a thickness of 4 μm on the bottom electrode layer 52 by use of the sputtering technique. The substrate temperature (i.e., the film formation temperature Ts) at the time of the sputtering processing was set at 475° C. With the measurement made on a film having been prepared under the same conditions, it was found that the Curie temperature of the Nb-PZT film 53 was equal to approximately 350° C. The film formation temperature Ts of 475° C. was thus higher than the Curie temperature Tc.

After the film formation had been performed, the polarization processing was begun before the substrate temperature fell to a temperature of 350° C. In this case, at the time at which the substrate temperature was equal to 475° C., the polarization processing was begun by the application of the radiofrequency voltage to the bottom electrode 52 via the matching box 23. The film formation chamber (i.e., the vacuum chamber) 10 was set at a degree of vacuum of 0.5 Pa and was set under the conditions of an $Ar/O_2$ mixed atmosphere ($O_2$ volume fraction: 50%). (The same atmosphere was kept through the film formation step and the polarization processing step.)

At this time, the radiofrequency power was equal to 30 W, and the DC component Vdc applied across the substrate (=the negative self-bias voltage) was equal to −120V. Also, the potential of the plasma in the plasma space, as measured with a single probe technique, was equal to 30V. It was thus found that the electric field $E_1$ was formed in the direction heading from the plasma space side toward the substrate side, and that a voltage of −150V was applied across the PZT film.

In this state, the temperature of the substrate B was allowed to fall from 475° C. to 300° C. at a temperature fall rate of 30° C./min. Thereafter, the radiofrequency voltage applied across the substrate B was turned off, and the substrate temperature was returned to the room temperature. An XRD analysis was made on the thus obtained piezoelectric film, and it was confirmed that the piezoelectric film had high orientational characteristics along the "a" axis.

An Ir layer was formed as the top electrode layer 54 on the obtained piezoelectric film, and patterning processing was performed by use of a lift-off technique. In this manner, a piezoelectric device 5 comprising the Ti—Ir bottom electrode 52, the Nb-PZT film 53, and the Ir top electrode 54, which were overlaid in this order on the Si substrate 51, was obtained.

Comparative Example 1

Figure 7:
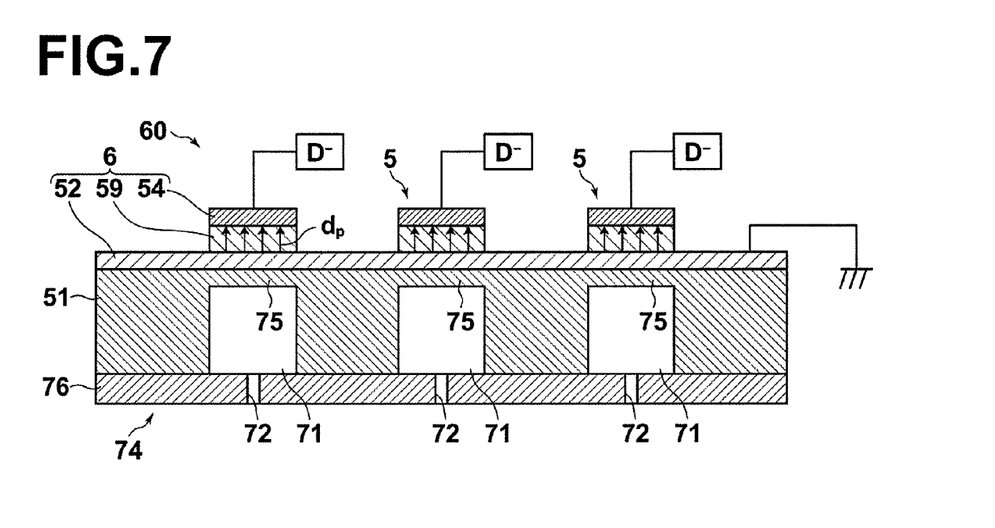
FIG. 7 is a sectional view showing a piezoelectric device, which utilizes a piezoelectric film obtained in Comparative Example 1, and a major part of an ink jet type recording head provided with the piezoelectric device.

In Comparative Example 1, an Nb-PZT film was formed by the film formation step performed in the same manner as that in Example 1. After the film formation step was performed, the polarization processing was not performed. In this manner, a piezoelectric film 59 having not been subjected to the polarization processing was obtained. As illustrated in FIG. 7, the piezoelectric film 59 had the spontaneous polarization $d_p$ in the direction heading from the substrate side toward the piezoelectric film surface side. In FIG. 7, a reference numeral 6 represents the piezoelectric device provided with the piezoelectric film 59, and a reference numeral 60 represents the ink jet type recording head.

Comparative Example 2

In Comparative Example 2, an Nb-PZT film was formed by the film formation step performed in the same manner as that in Example 1. Before the polarization processing was performed, the temperature of the piezoelectric film was allowed to fall to the room temperature. The thus obtained piezoelectric film was heated to a temperature of 100° C., and an electric field of 100 kV/cm was applied for 10 minutes. A piezoelectric device having been subjected to the reverse polarization processing was thus obtained.

As for each of the piezoelectric devices obtained in Example 1 and Comparative Examples 1 and 2, an actuation test was performed in the manner described below.

Firstly, each of the piezoelectric devices obtained in Example 1 and Comparative Example 2 was constituted for the positive voltage actuation, in which the top electrode layer 54 was set at the plus potential, and in which the bottom electrode layer 52 was set at the minus potential (the ground potential). The piezoelectric device obtained in Comparative Example 1 was constituted for the negative voltage actuation, in which the top electrode layer 54 was set at the minus potential, and in which the bottom electrode layer 52 was grounded.

Figure 8:
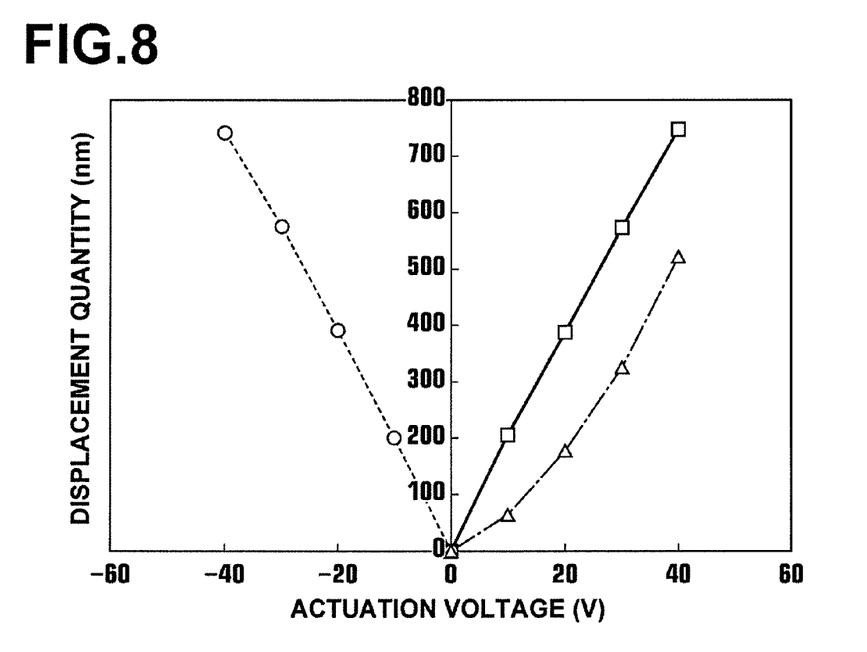
FIG. 8 is a graph showing dependency of a displacement quantity of each of a piezoelectric device, which utilizes a piezoelectric film obtained in Example 1, and piezoelectric devices, which utilize piezoelectric films obtained in Comparative Examples 1 and 2, upon an actuation voltage.

An AC voltage of a frequency of 1 kHz was applied, and the absolute value of the actuation voltage was increased little by little to 40V (in the cases of the negative voltage actuation, to −40V). In such cases, the obtained displacement quantity was measured by use of a laser Doppler meter. FIG. 8 is a graph showing dependency of a displacement quantity of each of a piezoelectric device, which utilizes a piezoelectric film obtained in Example 1, and piezoelectric devices, which utilize piezoelectric films obtained in Comparative Examples 1 and 2, upon an actuation voltage. In FIG. 8, the solid line indicates the results obtained with the piezoelectric device, which utilizes the piezoelectric film obtained in Example 1. Also, the dotted line indicates the results obtained with the piezoelectric device, which utilizes the piezoelectric film obtained in Comparative Example 1. Further, the single-dot chained line indicates the results obtained with the piezoelectric device, which utilizes the piezoelectric film obtained in Comparative Example 2.

As illustrated in FIG. 8, with each of the piezoelectric device, which utilized the piezoelectric film obtained in Example 1, and the piezoelectric device, which utilized the piezoelectric film obtained in Comparative Example 1, an equivalently large displacement was obtained by the application of the voltage of the equivalent magnitude. Also, with the piezoelectric device, which utilized the piezoelectric film obtained in Comparative Example 2, the displacement quantity was smaller than with each of the piezoelectric device, which utilized the piezoelectric film obtained in Example 1, and the piezoelectric device, which utilized the piezoelectric film obtained in Comparative Example 1. By the film formation step in this embodiment of the production process, the piezoelectric film having the markedly good crystal orientational characteristics was obtained. Also, in cases where the temperature was allowed to fall without the polarization step being performed, the obtained piezoelectric film had the spontaneous polarization $d_p$ in the direction heading from the substrate surface toward the top electrode. Therefore, with the piezoelectric device, which utilized the piezoelectric film obtained in Comparative Example 1, a large displacement was obtained in cases where the negative voltage actuation was performed.

Also, with the piezoelectric device utilizing the piezoelectric film obtained in Example 1, wherein, after the film formation step had been performed, the polarization processing was begun before the film formation temperature fell to a value lower than the Curie temperature, the equivalent displacement quantity was obtained. It was thus found that the piezoelectric device having the high orientational characteristics as in the cases where the polarization processing was not performed was obtained.

With the piezoelectric device as in Comparative Example 2, wherein the temperature was allowed to fall to the room temperature after the film formation had been performed, at the stage prior to the polarization processing, as in the cases of the piezoelectric device utilizing the piezoelectric film obtained in Comparative Example 1, the piezoelectric film had the markedly good crystal orientational characteristics and had the spontaneous polarization $d_p$ in the direction heading from the substrate surface toward the top electrode. As for the piezoelectric device having been subjected to the polarization processing, wherein the piezoelectric film was heated again and wherein the electric field was applied across the piezoelectric film, it was considered that, since the polarization processing was not performed sufficiently, the displacement quantity was small.

As described above, the piezoelectric film obtained in Example 1 had the piezoelectric characteristics as high as the piezoelectric characteristics of the piezoelectric film having not been subjected to the polarization processing (as in Comparative Example 1). It is presumed that, since the polarization was begun after the film formation without allowing the substrate temperature to fall to a value lower than the Curie temperature, the piezoelectric film was subjected to the polarization processing so as to have the history such that the piezoelectric film had not experienced the reverse polarization direction (the polarization direction heading toward the top electrode) after the film formation.

Example 2

In Example 2, a piezoelectric film was produced by the second embodiment of the process for producing a piezoelectric film in accordance with the present invention. The device constitution and the film formation conditions were identical with those in Example 1. While the substrate temperature was being kept at 475° C. after the film formation was performed, a voltage of minus 50V was applied across the bottom electrode, and the radiofrequency voltage was applied to the Nb-PZT target side. In this manner, the sputtering plasma was formed. At this time, the shutter 26 was located above the target, and the film deposition on the substrate B was thereby prevented. However, by the plasma coming from the side along the shutter 26, the plasma space was kept at a potential of approximately 10V.

In this state, the temperature of the substrate B was allowed to fall from 475° C. to 3000C at a temperature fall rate of 30° C./min. Thereafter, the voltage applied across the substrate B and the radiofrequency voltage applied across the target were turned off, and the temperature of the substrate B was returned to the room temperature. A top electrode layer was formed on the obtained piezoelectric film.

As for the thus obtained piezoelectric device of Example 2, the displacement was measured by use of a laser Doppler meter. As in Example 1, good displacement was obtained in cases where the top electrode side was set at the plus potential, and in cases where the bottom electrode side was set at the minus potential. The piezoelectric constant calculated from the displacement was as good as $d_{31}$=250 pm/V.

Figure 9:
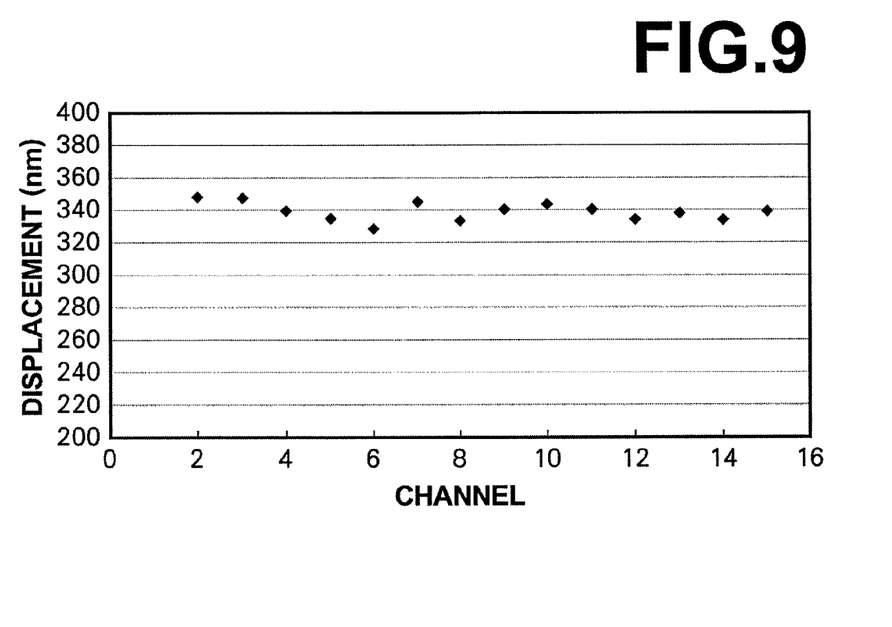
FIG. 9 is a graph showing variation in displacement quantity of a piezoelectric device, which utilizes a piezoelectric film obtained in Example 2.

Ordinarily, in cases where the patterning processing is performed by use of the lift-off technique after the top electrode has been formed, a plurality of the piezoelectric devices (channels) are formed on one substrate. As for each of 15 channels sampled at random from the plurality of the channels, which were obtained simultaneously by the process of Example 2, the displacement quantity was measured, and variation in displacement quantity was calculated. FIG. 9 is a graph showing variation in displacement quantity of a piezoelectric device, which utilizes a piezoelectric film obtained in Example 2.

Figure 10:
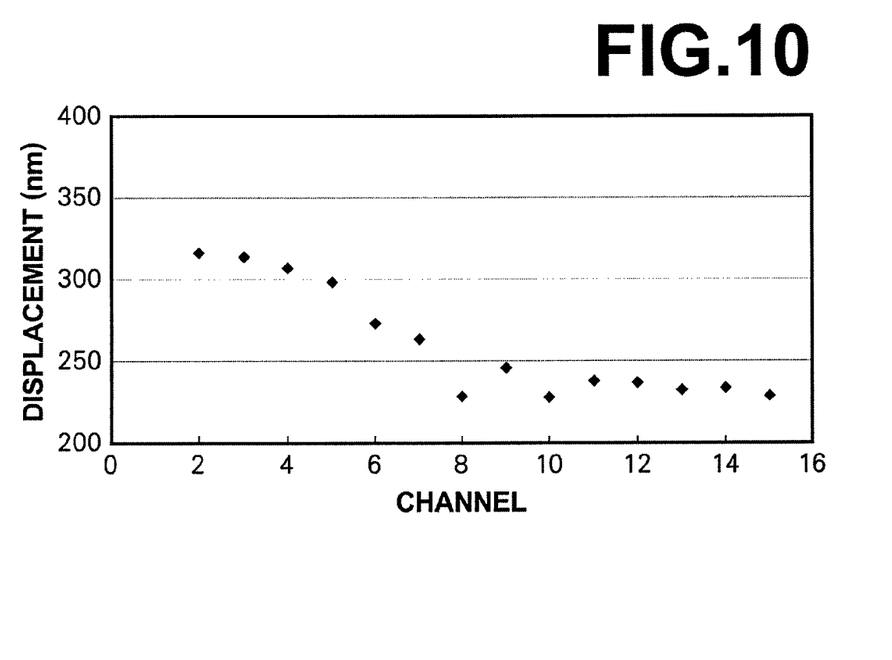
FIG. 10 is a graph showing variation in displacement quantity of the piezoelectric device, which utilizes the piezoelectric film obtained in Comparative Example 2.

For comparison, as for each of 15 channels sampled at random from the plurality of the channels, which were obtained simultaneously by the process of Comparative Example 2 described above, the displacement quantity was measured, and variation in displacement quantity was calculated. FIG. 10 is a graph showing variation in displacement quantity of the piezoelectric device, which utilizes the piezoelectric film obtained in Comparative Example 2.

In the cases of the channels obtained by the process of Example 2, the variation was such that the standard deviation was equal to approximately 5.7, and good uniformity was obtained. In the cases of the channels obtained by the process of Comparative Example 2, the standard deviation was equal to approximately 34, and the variation was markedly large.

As described above, it was revealed that the piezoelectric device utilizing the piezoelectric film produced by the process for producing a piezoelectric film in accordance with the present invention has the high piezoelectric characteristics and has little variation in piezoelectric characteristics.

INDUSTRIAL APPLICABILITY

The piezoelectric film in accordance with the present invention is capable of being utilized appropriately for piezoelectric actuators for use in ink jet type recording heads, magnetic recording and reproducing heads, micro electromechanical systems (MEMS) devices, micro pumps, ultrasonic probes, and the like.

What is claimed is:

1. A process for producing a piezoelectric film, comprising the steps of:
   i) forming a piezoelectric film on a substrate by a sputtering technique at a film formation temperature higher than a Curie temperature,
   ii) forming an electric field across the piezoelectric film in a direction heading from a surface side of the piezoelectric film toward the substrate side before a temperature of the piezoelectric film having been formed falls to a temperature lower than the Curie temperature, polarization processing being caused to begin by the formation of the electric field across the piezoelectric film, and iii) allowing the temperature of the piezoelectric film to fall to a temperature lower than the Curie temperature in the state in which the electric field is being formed.

2. A process as defined in claim 1 wherein the electric field is formed by a negative self-bias voltage occurring at the time at which a radiofrequency voltage is applied across the substrate.

3. A process as defined in claim 1 wherein the electric field is formed by a technique for setting the substrate at a minus potential, and setting a plasma space, which is located on the surface side of the substrate, at a potential higher than the minus potential.

4. A process as defined in claim 1 wherein the electric field is formed by a technique for setting the substrate at a ground potential or a minus potential, and setting the surface of the piezoelectric film at a plus potential.

5. A process as defined in claim 4 wherein the surface of the piezoelectric film is set at the plus potential by application of plus ions to the surface of the piezoelectric film.

6. A piezoelectric film obtainable on the substrate by a process for producing a piezoelectric film as defined in claim 1,
wherein the piezoelectric film has spontaneous polarization in the direction heading from the surface of the piezoelectric film toward the substrate side and has a piezoelectric constant of at least 200 pm/V.

7. A piezoelectric film as defined in claim 6 wherein the piezoelectric film contains a perovskite type oxide that is lead zirconate titanate or is a mixture of lead zirconate titanate and at least one kind of element selected from the group consisting of Nb, W, Ni, and Bi, with the proviso that the perovskite type oxide may contain inevitable impurities.

* * * * *